United States Patent
Chen et al.

(10) Patent No.: US 10,319,886 B2
(45) Date of Patent: *Jun. 11, 2019

(54) LED ASSEMBLY FOR OMNIDIRECTIONAL LIGHT APPLIANCES

(71) Applicants: HUGA OPTOTECH INC., Taichung (TW); Interlight Optotech Corporation, Yangmei, Taoyuan County (TW)

(72) Inventors: Tzer-Perng Chen, Yangmei (TW); Tzu-Chi Cheng, Yangmei (TW)

(73) Assignees: Epistar Corporation, Hsinchu (TW); Kaistar Lighting (Xiamen) Co., Ltd., Xiamen (CN)

(*) Notice: Subject to any disclaimer, the term of this patent is extended or adjusted under 35 U.S.C. 154(b) by 0 days.

This patent is subject to a terminal disclaimer.

(21) Appl. No.: 15/955,652

(22) Filed: Apr. 17, 2018

(65) Prior Publication Data

US 2018/0233635 A1 Aug. 16, 2018

Related U.S. Application Data

(63) Continuation of application No. 15/297,554, filed on Oct. 19, 2016, now Pat. No. 9,947,839, which is a
(Continued)

(30) Foreign Application Priority Data

Oct. 7, 2013 (TW) .............................. 102136176 A

(51) Int. Cl.
*H01L 33/52* (2010.01)
*H01L 33/50* (2010.01)
(Continued)

(52) U.S. Cl.
CPC .......... *H01L 33/504* (2013.01); *H01L 33/486* (2013.01); *H01L 33/507* (2013.01);
(Continued)

(58) Field of Classification Search
CPC ..... H01L 33/504; H01L 33/507; H01L 33/52; H01L 33/62
See application file for complete search history.

(56) References Cited

U.S. PATENT DOCUMENTS 8,319,248 B2   11/2012   Seo
8,975,657 B2 *  3/2015   Haraguchi ............ H01L 33/486
                                                                257/100
(Continued)

FOREIGN PATENT DOCUMENTS

JP      2011-035198 A     2/2011
JP      2012099726 A      5/2012
(Continued)

*Primary Examiner* — Quoc D Hoang
(74) *Attorney, Agent, or Firm* — Muncy, Geissler, Olds & Lowe, P.C.

(57) ABSTRACT

This disclosure discloses an LED assembly. The LED assembly includes a transparent mount with a top surface and a bottom surface opposite to the top surface, an LED chip arranged on the top surface, an electrode plate, a first phosphor layer having a first phosphor, and a second phosphor layer having a second phosphor, wherein the transparent mount and the electrode plate substantially have a same width. The electrode plate is arranged on an edge of the top surface and electrically connected to the LED chip.

20 Claims, 8 Drawing Sheets

Related U.S. Application Data continuation of application No. 14/493,940, filed on Sep. 23, 2014, now Pat. No. 9,502,622.

(51) Int. Cl.
*H01L 33/48* (2010.01)
*H01L 33/62* (2010.01)

(52) U.S. Cl.
CPC .... *H01L 33/62* (2013.01); *H01L 2224/48137* (2013.01); *H01L 2224/48464* (2013.01); *H01L 2224/49109* (2013.01); *H01L 2924/181* (2013.01)

(56) References Cited

U.S. PATENT DOCUMENTS

| | | | |
|---|---|---|---|
| 9,016,900 B2* | 4/2015 | Takeuchi | F21V 23/001 362/249.02 |
| 9,136,447 B2 | 9/2015 | Yoneda | |
| 9,502,622 B2* | 11/2016 | Cheng | H01L 33/504 |
| 2007/0139949 A1 | 6/2007 | Tanda et al. | |
| 2013/0058080 A1 | 3/2013 | Ge et al. | |
| 2013/0170174 A1* | 7/2013 | Chou | H01L 25/0753 362/84 |
| 2014/0027804 A1 | 1/2014 | Yoneda et al. | |
| 2014/0240979 A1 | 8/2014 | Chen et al. | |

FOREIGN PATENT DOCUMENTS

| | | |
|---|---|---|
| JP | 2012138454 A | 7/2012 |
| JP | 2012-212682 A | 11/2012 |
| TW | M459520 U | 8/2013 |
| WO | WO 2012/090350 A1 | 7/2012 |

\* cited by examiner

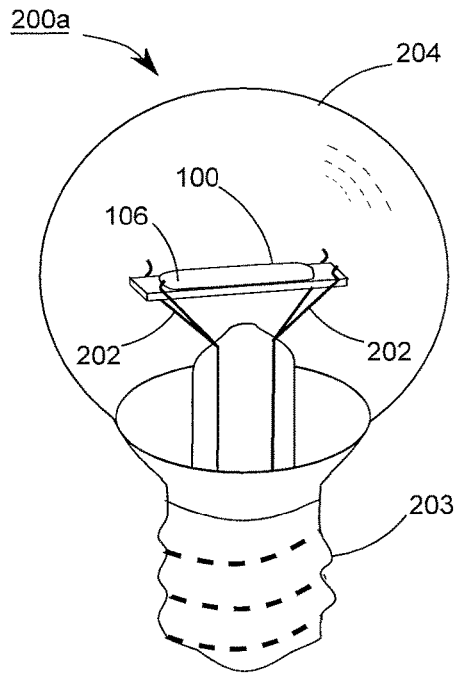
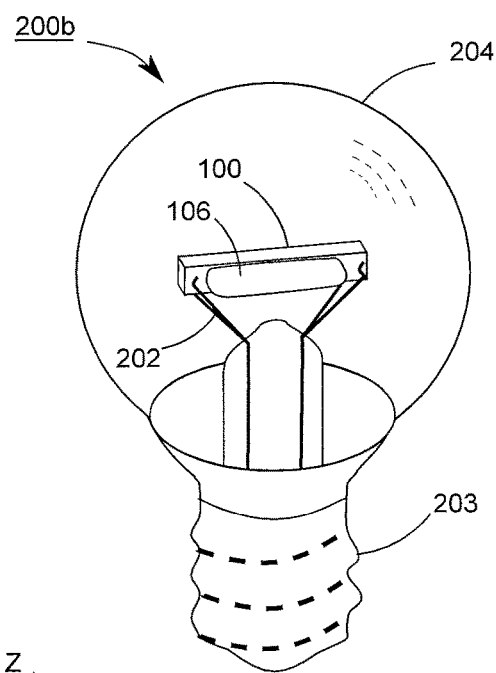
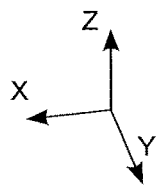
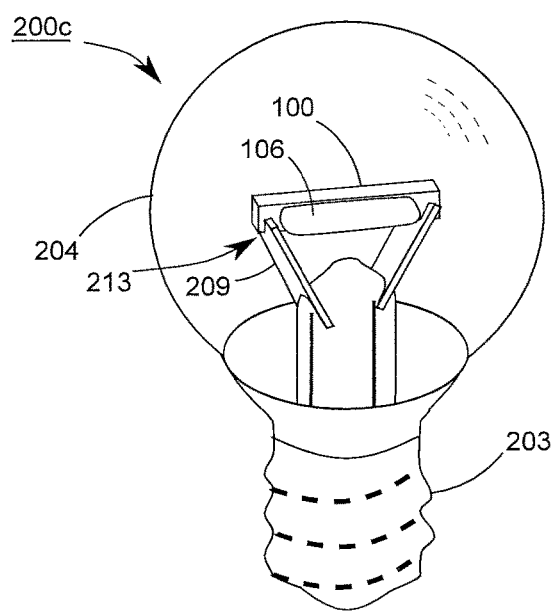
FIG. 4A
FIG. 4B
FIG. 4C

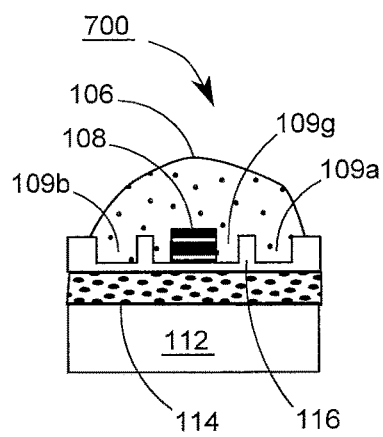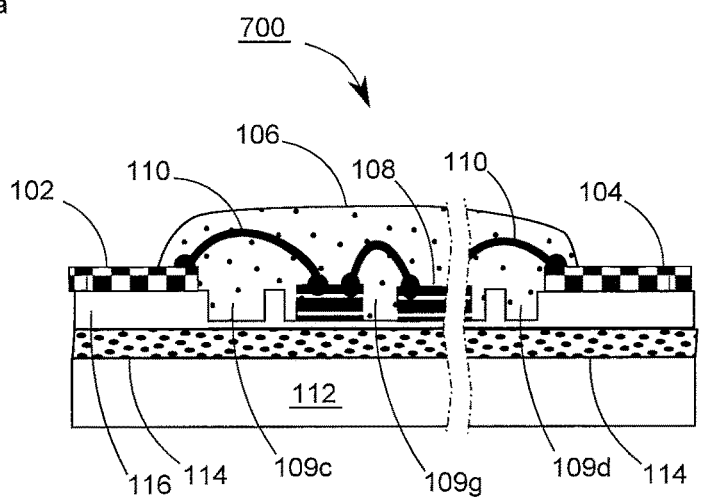
FIG. 17A
FIG. 17B

LED ASSEMBLY FOR OMNIDIRECTIONAL LIGHT APPLIANCES

CROSS-REFERENCE TO RELATED APPLICATION

This application is a continuation application of U.S. patent application Ser. No. 15/297,554, filed on Oct. 19, 2016, which is a continuation application of U.S. patent application Ser. No. 14/493,940, filed on Sep. 23, 2014, which claims priority to and the benefit of Taiwan Application Serial Number 102136176 filed on Oct. 7, 2013, which is incorporated by reference in its entirety.

BACKGROUND

The present disclosure relates generally to light emitting diode (LED) assemblies and their applications, more specifically to the LED assemblies suitable for omnidirectional light appliances.

LED has been used in different kinds of appliances in our life, such as traffic lights, car headlights, street lamps, computer indicators, flash lights, LCD backlight modules, and so on. LED chips, which are used as light sources for appliances, are produced by wafer manufacturing process in the front end, and then undergo LED packaging in the back end to result in LED assemblies or apparatuses.

LED packaging mainly provides mechanical, electrical, thermal and optical supports to LED chips. LED chips, which are kind of semiconductor products, are prone to degradation, or aging, if being exposed for a long time in an atmosphere full of humidity or chemical. To isolate the LED chips from unfriendly atmosphere, epoxy resins are commonly used to cover and seal them. Heat dissipation and light extraction should be also considered for LED packaging, such that LED products could have long lifespan and high brightness. For example, the heat generated at a p-n junction in an LED chip, if not being well dissipated, could deteriorate the LED chip, shorten its lifespan, and downgrade its reliability. Optical design, such as the way to extract and direct the light into a desired angle or distribution, also plays an important issue for LED packaging.

Design for packaging white LEDs is more complex and needs to further consider color temperature, color rendering index, phosphor, etc. A white LED could be provided using phosphor to convert a portion of the blue light from a blue LED chip into green/yellow light, such that the mixture of the lights is perceived as white light by human eyes. Because human eyes are vulnerable to high-intensity blue light, the blue light from a blue LED chip in a white LED package should not emit outward directly without its intensity being attenuated. In other words, the blue light should be kind of "sealed" or "capsulated" so as to prevent blue light leakage to human eyes.

Furthermore, it is a constant trend in the LED industry to pursue LED packaging processes with high stability, low cost, and high product yield.

SUMMARY

This disclosure discloses an LED assembly. The LED assembly includes a substrate, a mount, a first LED chip, an electrode plate and a layer. The substrate has a first top surface. The mount has a second top surface and a bottom surface which is opposite to the second top surface and is positioned on the first top surface in a configuration of forming a recess. The first LED chip includes a third top surface, and arranged on the first top surface and in the recess. The electrode plate includes a fourth top surface, arranged on the second top surface, and electrically connected to the first LED chip. The layer includes a phosphor, and covering the first LED chip, the first top surface, and the electrode plate. The fourth top surface is higher than the third top surface in an elevation from the first top surface.

This disclosure also discloses an LED blub. The LED bulb includes an LED assembly, a holding element and a transparent cover. The LED assembly includes substrate, a mount, a first LED chip, an electrode plate and a layer. The substrate has a first top surface. The mount has a second top surface and a bottom surface which is opposite to the second top surface and is positioned on the first top surface in a configuration of forming a recess. The first LED chip includes a third top surface, and arranged on the first top surface and in the recess. The electrode plate includes a fourth top surface, arranged on the second top surface, and electrically connected to the first LED chip. The layer includes a phosphor, and covering the first LED chip, the first top surface, and the electrode plate. The fourth top surface is higher than the third top surface in an elevation from the first top surface.

BRIEF DESCRIPTION OF THE DRAWINGS

Non-limiting and non-exhaustive embodiments of the present disclosure are described with reference to the following drawings. In the drawings, like reference numerals refer to like parts throughout the various figures unless otherwise specified. These drawings are not necessarily drawn to scale. Likewise, the relative sizes of elements illustrated by the drawings may differ from the relative sizes depicted.

The disclosure can be more fully understood by the subsequent detailed description and examples with references made to the accompanying drawings, wherein:

FIGS. 4A, 4B and 4C illustrate LED bulbs, each using the LED assembly of FIG. 1 as its filament;

FIGS. 17A and 17B demonstrate two cross sectional views of another LED assembly.

DETAILED DESCRIPTION

Figure 1:
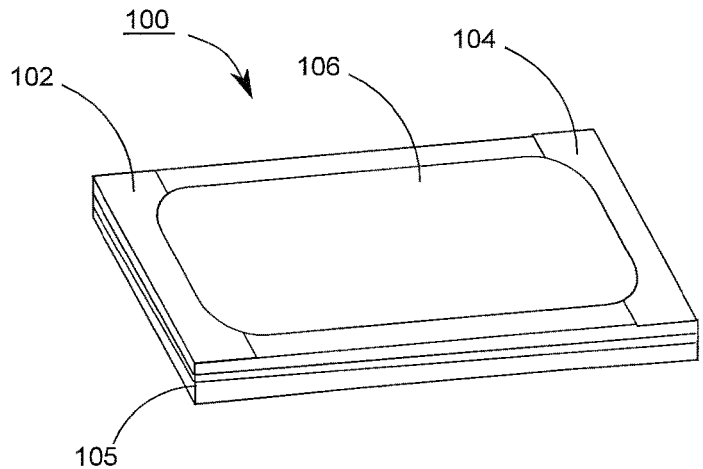
FIG. 1 shows an LED assembly according to an embodiment of the disclosure.
Figure 2:
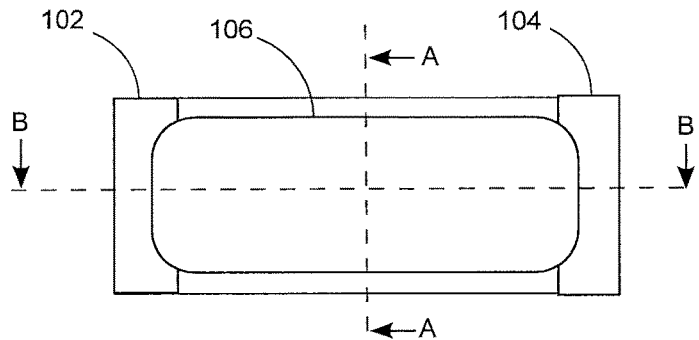
FIG. 2 shows a top view of the LED assembly in FIG. 1.

A perspective view of an LED assembly 100 according to an embodiment of the disclosure is described in detail with reference to FIG. 1, while FIG. 2 shows a top view of the LED assembly 100. These drawings are only illustrative, and the dimensions or ratios therein are not intended to limit the invention.

Shown in FIGS. 1 and 2, the LED assembly 100 has a laminate substrate 105 with a rectangular top surface. The manufacturing method and the structure of the laminate substrate 105 will be detailed later. On the top surface of the laminate substrate 105, there are two conductive electrode plates 102 and 104 at two opposite ends respectively. A phosphor layer 106 is formed on the top surface and positioned on an area substantially between the two conductive electrode plates 102 and 104.

Figure 3A:
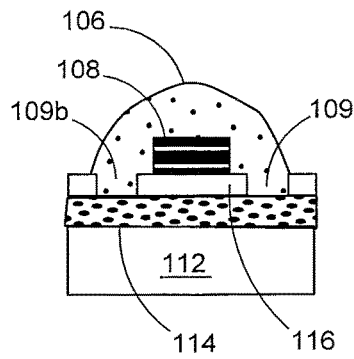
FIGS. 3A and 3B show two different cross sectional views of the LED assembly in FIG. 1.
Figure 3B:
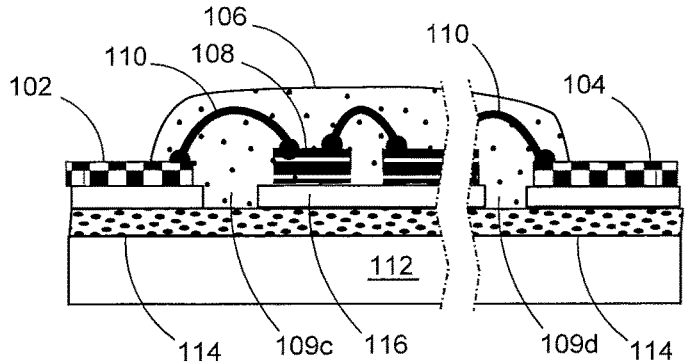

FIGS. 3A and 3B show cross sectional views of the LED assembly 100, resulted from the cutting planes AA and BB respectively. As shown in FIGS. 3A and 3B, the laminate substrate 105 is composed of three layers, including a transparent substrate 112, a phosphor layer 114 and a transparent mount 116. The phosphor layer 114 is sandwiched between the transparent mount 116 and the transparent substrate 112. Positioned on the transparent mount 116 are the conductive electrode plates 102 and 104, and LED chips 108. The phosphor layer 106 covers and surrounds the LED chips 108, which are mounted on the transparent mount 116, and therefore the LED chips 108 are sandwiched between the phosphor layer 106 and the transparent mount 116. Bonding wires 110 provide electrical interconnection between the LED chips 108 and also electrically connect two of the LED chips 108 to the conductive electrode plates 102 and 104.

In this specification, "transparent" means having the property of transmitting rays of visible light, and could refer to as transparent, translucent or semitransparent. In some embodiments, the transparent mount 116 and the transparent substrate 112 are not electrically conductive, and could be made of the same or different material. For example, they could be sapphire, silicon carbide, or diamond-like carbon.

The LED chips 108 in FIGS. 1, 2, 3A and 3B are all blue LED chips in one embodiment and are mounted and arranged as a row on the transparent mount 116. This invention is not limited to the abovementioned, nevertheless. Based on desired applications, the LED chips 108 might be arranged to form any pattern on the transparent mount 116, which for instance could have two or three rows. In other embodiments, some of the LED chips 108 emit blue light with a dominant wavelength ranging from 430 nm to 480 nm, some emit red light with a dominant wavelength ranging from 630 nm to 670 nm, and some emit green light with a dominant wavelength ranging from 500 nm to 530 nm.

An LED chip 108 might have only one single LED cell, whose forward voltage is about 2 to 3 volts, and this kind of LED chip is referred to as a low-voltage LED chip hereinafter. Comparatively, an LED chip 108 in another embodiment might include several LED cells connected in series, and is referred to as a high-voltage LED chip hereinafter, because its forward voltage might be as high as 12V, 24V, or 48V, much higher than that of a low-voltage LED chip. In one high-voltage LED chip, each LED cell has a light-emitting layer, and the LED cell might be formed on an epitaxial or non-epitaxial substrate. More specifically, the LED cells in the high-voltage LED chip are electrically connected to each other on a common substrate; not by wire bonding but by some patterned conductive strips produced by wafer processes, such as metallization or lithography that processes all the LED cells at the same time. The common substrate might be an epitaxial or non-epitaxial substrate. In FIGS. 1, 2, 3A and 3B, the LED chips 108 are connected in series so the forward voltage is the summation of the forward voltages of the individual LED chips 108. This disclosure is not limited to the abovementioned, however. In some embodiments, the LED chips 108 could be connected in many different configurations, including series, parallel, bridge or any combination thereof.

Trenches 109a, 109b, 109c and 109d are formed in the transparent mount 116. Trenches 109a and 109b shown in FIG. 3A are substantially in parallel to each other, and trenches 109c and 109d shown in FIG. 3B are substantially in parallel to each other. As derivable from FIGS. 3A and 3B, the trenches 109a, 109b, 109c and 109d are positioned to substantially surround the LED chips 108. In other words, the area where the LED chips 108 is mounted on the transparent mount 116 is between the trenches 109a and 109b, and between trenches 109c and 109d as well. As shown in FIGS. 3A and 3B, the phosphor layer 106 entirely fills up the trenches 109a, 109b, 109c and 109d, and through them contacts the phosphor layer 114.

Both the phosphor layers 106 and 114 have at least one kind of phosphor. For example, the phosphor in the phosphor layers 106 and 114 could be excited by the blue light (with a dominant wavelength of 430 nm~480 nm) emitted from the LED chips 108 to generate yellow light (with a dominant wavelength of 570 nm~590 nm) or yellowish-green light (with a dominant wavelength of 540 nm~570 nm), such that the mixture is perceivable as white light by human eyes. The phosphor layers 106 and 114 could be transparent body in which phosphor is dispersed. The transparent body is epoxy resin, or silicone for example. The phosphor in the phosphor layer 106 might be the same as or different from that in the phosphor layer 114. The phosphor could include, but is not limited to, yttrium aluminum garnet (YAG), or terbium aluminum garnet (TAG). The phosphor layers 106 and 114 might have one or more kinds of phosphor. For instance, in one embodiment the phosphor layers 106 and 114 have two kinds of phosphor, one emitting yellow light and the other emitting red light. Phosphor emitting green light could be also included in some embodiments.

A phosphor capsule formed by the phosphor layers 106 and 114 substantially encapsulates each LED chip 108. The light emitted from the LED chips 108, whether it goes upward or sideward, confronts the phosphor layer 106 and the light emitted from the LED chips 108, whether it goes downward, confronts the phosphor layer 114. In case that some of the LED chips 108 are blue LED chips, the blue light therefrom excites the phosphor in the phosphor layer 106 or 114 to generate a yellow light or yellowish-green light such that a mixing light of the blue light and the yellow light or yellowish-green light is sensed by a human eye as a white light, so that the total intensity of the blue light is attenuated to avoid any harmful effect to human eyes.

FIG. 4A illustrates an LED bulb 200a using the LED assembly 100 as its filament. The LED bulb 200a has two clamps 202, each of which might be in a shape of V or Y. The clamps 202 are made of conductive material, and the two projecting prongs of each clamp 202 clamp one conductive electrode plate (either 102 or 104) to hold the LED assembly 100 within a cover 204 of the LED bulb 200a. In FIG. 4A, the surface with the phosphor layer 106 faces upward (along the z direction). The clamps 202 also electrically connect both the conductive electrode plates 102 and 104 to the Edison screw base 203 of the LED bulb 200a, which provides the electric power required for the LED assembly 100 to emit light. FIG. 4B is similar with FIG. 4A, but differs in the direction that the LED assembly 100 faces. In FIG. 4B, the surface of the LED assembly 100 having the phosphor layer 106 faces sideward (along the y direction), and is substantially perpendicular with the screw axis (along the z direction) of the LED bulb 200b in FIG. 4B. FIG. 4C is similar with FIG. 4B, but differs in that the supports 209 are solid strips with a rectangular shape. Each of the supports 209 has a notch 213 at its end to support the LED assembly 100 within a cover 204 of the LED bulb 200c. The supports 209 could be made of metal or some kind of conductive material, capable of conducting electric current from the Edison screw base 203 to the conductive electrode plates 102 and 104 at ends of the LED assembly 100. Because of the transparency of the transparent substrate 112 and the transparent mount 116, the LED bulb 200a, 200b and 200c all could be omnidirectional lighting apparatuses.

Figure 5:
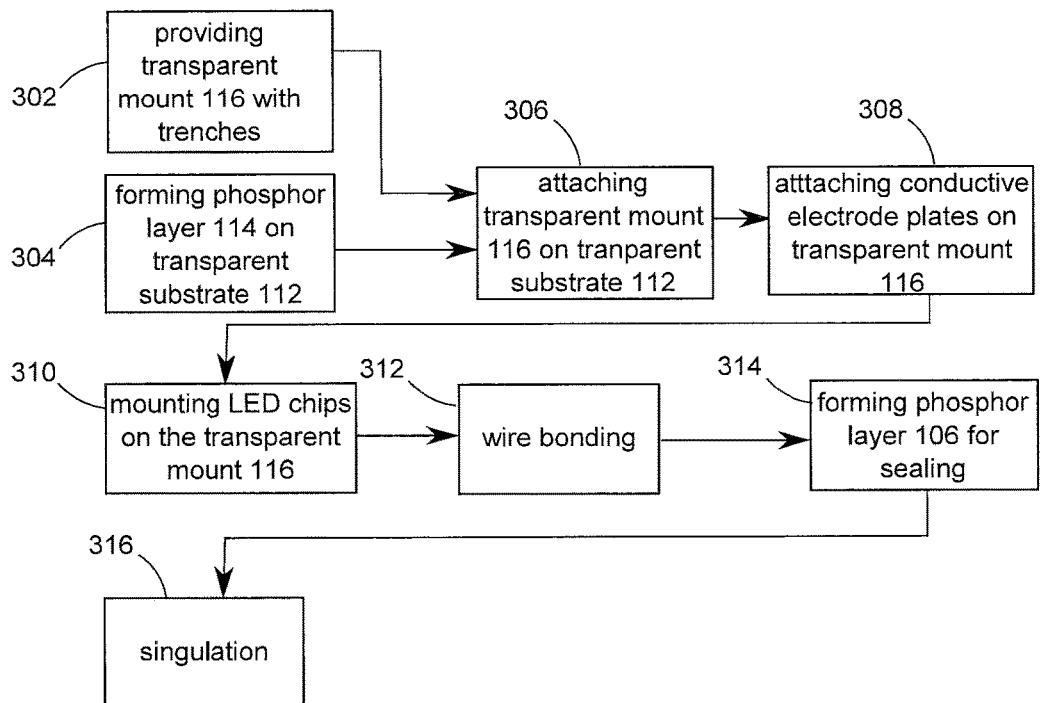
FIG. 5 demonstrates a method for manufacturing the LED assembly.

FIG. 5 demonstrates a process flow for manufacturing a LED assembly 100. The steps are detailed in reference with the following drawings.

Figure 6:
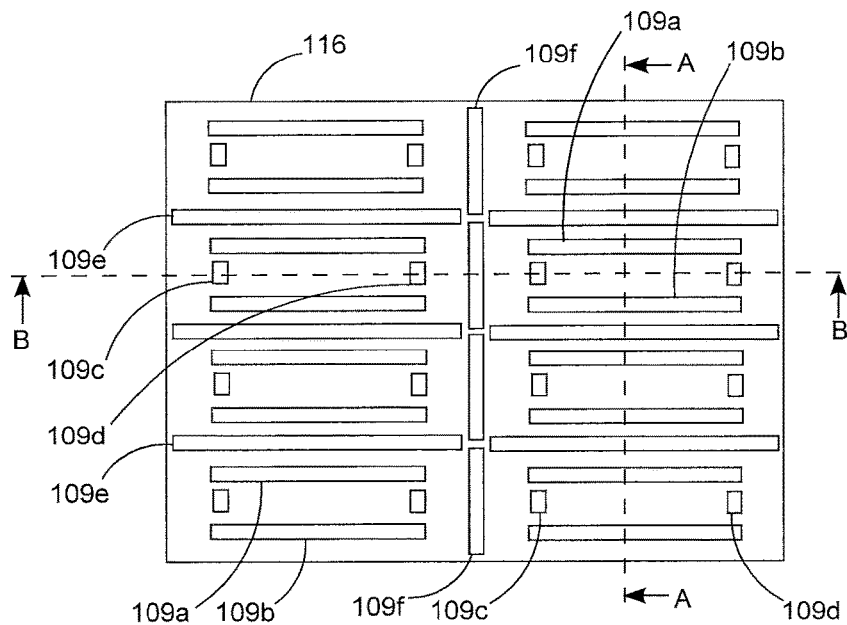
FIG. 6 shows the pattern on a transparent mount.

Regarding to step 302, a sheet of the transparent mount 116 is provided and has a plurality of the same or similar repeated patterns on its surface as shown in FIG. 6. The pattern on the transparent mount 116 in FIG. 6 has 2 rows in a horizontal direction and 4 columns in a vertical direction to produce eight LED assemblies 100 at one time. The example in FIG. 6 is not intended to limit the invention. From one single sheet, some embodiments of the invention could produce only one LED assembly 100, and others might produce more than 8 LED assemblies 100.

Figure 7A:
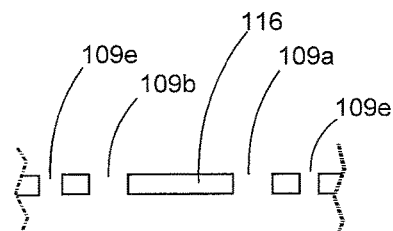
FIGS. 7A and 7B are cross sectional views of a transparent mount.
Figure 7B:
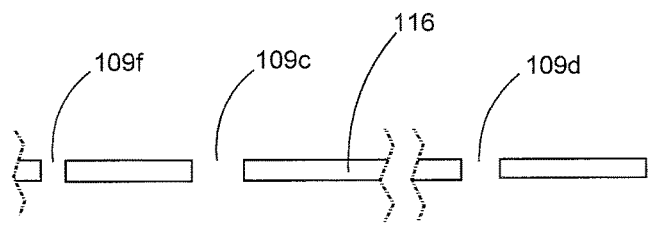

The pattern in FIG. 6 is composed of trenches 109a, 109b, 109c, 109d, 109e, and 109f, where the trenches 109a are substantially in parallel to the trenches 109b, and the trenches 109c are substantially in parallel to the trenches 109d. FIGS. 7A and 7B are cross sectional views of the transparent mount 116 resulted from the cutting planes AA and BB in FIG. 6 respectively. The trenches 109a, 109b, 109c and 109d substantially enclose the area where the LED chips 108 are going to be mounted. The trenches 109e and 109f substantially define the location for a single LED assembly 100, to ease the singulation in the following step which will be detailed later. The trenches 109a, 109b, 109c, 109d, 109e, and 109f might be formed by dry or wet etching, for example.

Figure 8A:
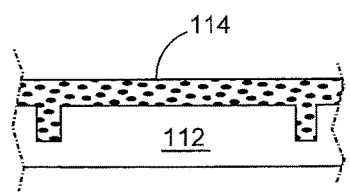
FIGS. 8A and 8B are cross sectional views of a transparent mount after the formation of a phosphor layer.
Figure 8B:
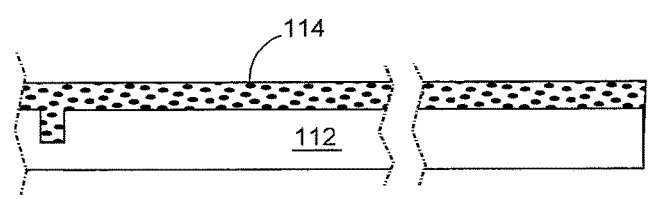

Regarding to step 304, coating or spraying is used to form the phosphor layer 114 on the transparent substrate 112, as demonstrated in FIGS. 8A and 8B. Some ditches are formed in the transparent substrate 112 prior to the formation of the phosphor layer 114. These ditches preferably locate just under the trenches 109e and 109f after the transparent mount 116 stacks on the transparent substrate 112 for easily singulating.

Figure 9:
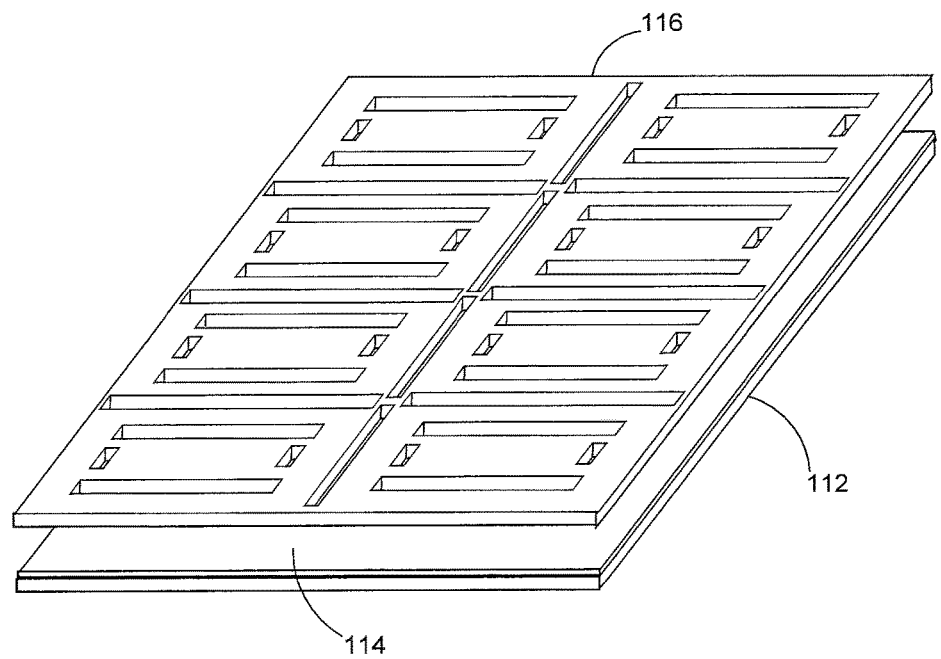
FIG. 9 demonstrates a transparent mount is attached on a transparent substrate using a phosphor layer as a glue layer.
Figure 10A:
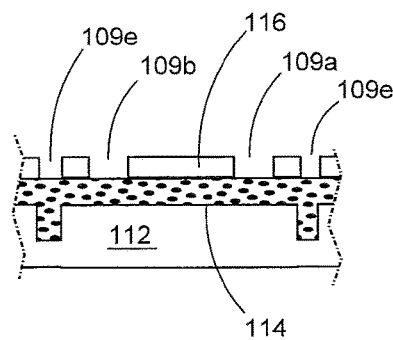
FIGS. 10A and 10B are cross sectional views after a transparent mount is secured on a transparent substrate.
Figure 10B:
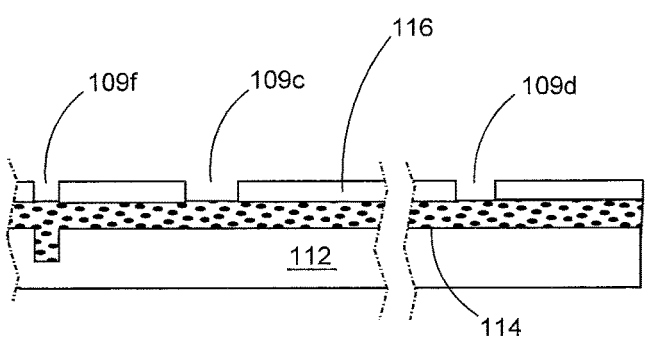

Regarding to step 306, the transparent mount 116 is attached on the transparent substrate 112 using the phosphor layer 114 or an additional transparent material as a glue layer, as demonstrated in FIG. 9. FIGS. 10A and 10B are cross sectional views corresponding to FIGS. 7A and 7B after the transparent mount 116 is attached on the transparent substrate 112.

Figure 11A:
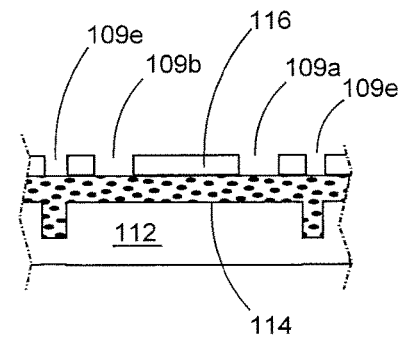
FIGS. 11A and 11B are cross sectional views after the formation of conductive electrode plates.
Figure 11B:
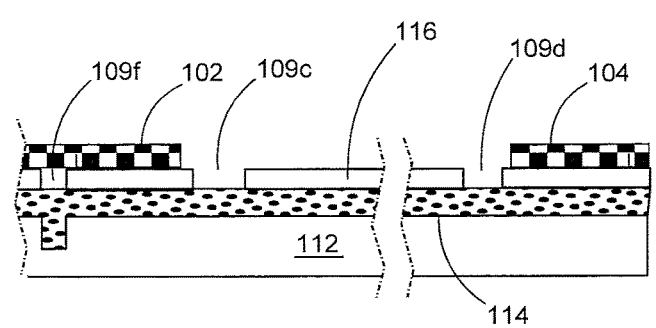

Regarding to step 308, the conductive electrode plates 102 and 104 are formed on the transparent mount 116, as demonstrated in FIGS. 11A and 11B. Some metal films or strips could be attached on proper areas of the transparent mount 116 to be the conductive electrode plates 102 and 104.

Figure 12A:
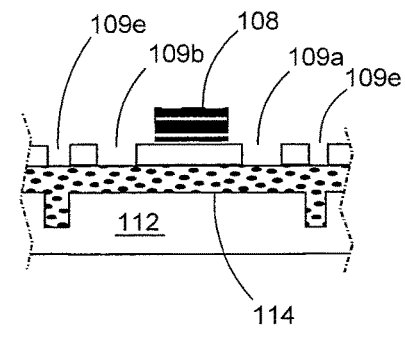
FIGS. 12A and 12B are cross sectional views after mounting LED chips.
Figure 12B:
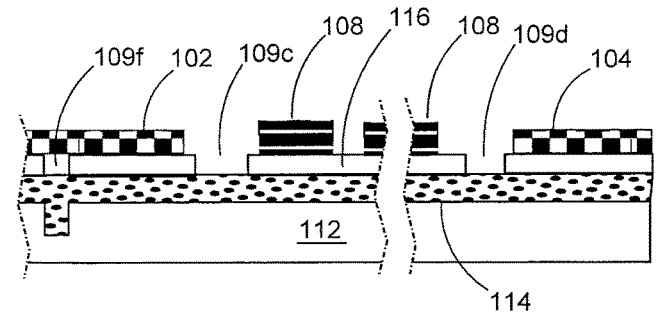

Referring to Step 310, the LED chips 108 are mounted on the transparent mount 116 by way of silver paste for example, as shown in FIGS. 12A and 12B which respectively correspond to FIGS. 11A and 11B.

Figure 13A:
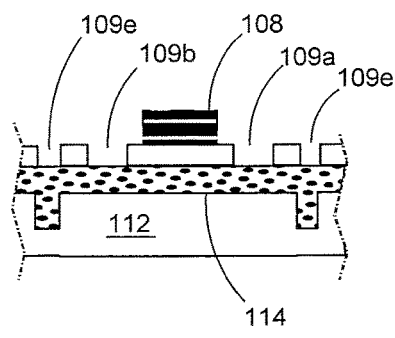
FIGS. 13A and 13B are cross sectional views after forming bonding wires.
Figure 13B:
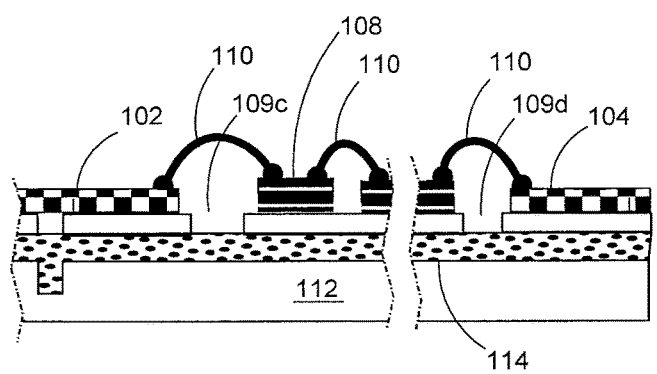

Referring to Step 312, bonding wires 110 are formed to provide electric interconnection between the LED chips 108, and between the LED chips 108 and the conductive electrode plates 102 and 104, as demonstrated in FIGS. 13A and 13B, which respectively correspond to FIGS. 12A and 12B.

Figure 14A:
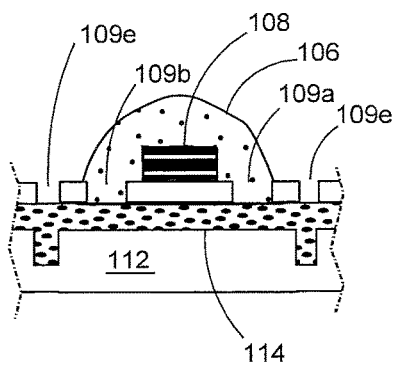
FIGS. 14A and 14B are cross sectional views after the formation of a phosphor layer.
Figure 14B:
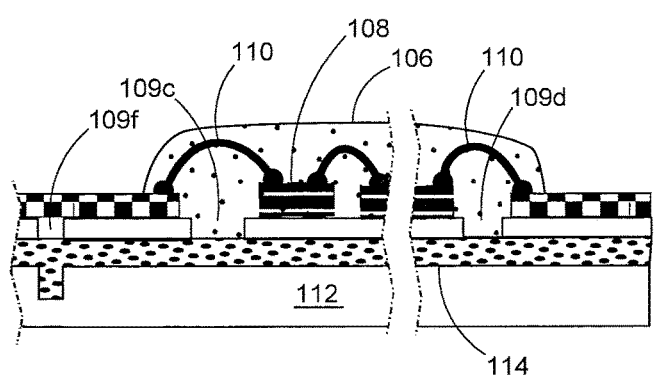

Regarding to step 314, the phosphor layer 106 is formed to cover or seal the bonding wires 110, the LED chips 108, and the trenches 109a, 109b, 109c and 109d, as shown in FIGS. 14A and 14B, which respectively correspond to FIGS. 13A and 13B. In FIGS. 14A and 14B, the phosphor layer 106 does not extend over the trenches 109e and 109f. In one embodiment, the phosphor layer 106 is formed on the LED chips 108 by dispensing.

Referring to Step 316, the transparent substrate 112 and the transparent mount 116 are singulated, by cleaving, laser cutting, carbon dioxide laser cutting, for example to form a plurality of individual LED assemblies 100. As aforementioned, the transparent mount 116 is capable of produce eight LED assemblies 100 at one time. These LED assemblies 100 in FIGS. 14A and 14B could be separated by cleaving along the trenches 109e and 109f, so as to finalize the LED assemblies 100, whose cross sectional views have been demonstrated in FIGS. 3A and 3B, which respectively correspond to FIGS. 14A and 14B.

The method exemplified in FIG. 5 produces no pattern at the backside of the transparent substrate 112. Therefore, handling, holding or supporting the transparent substrate 112 could be done via the backside of the transparent substrate 112 where scratches are not a concern. Accordingly, the yield rate of the LED assemblies 100 could be improved.

In another embodiment, some of the phosphor layer 106 is inside the trenches 109a, 109b, 109c, and 109c, but does not completely fill them up. The phosphor 106, nevertheless, preferably covers at least one sidewall in each of the trenches 109a, 109b, 109c, and 109c such that the phosphor 106 form walls inside the trenches to surround the area where the LED chips 108 are disposed.

The bonding wires 110 are used for electrical interconnection in FIGS. 3A and 3B, but this invention is not limited to this embodiment. Another embodiment of this disclosure has a printed circuit on the transparent substrate 116, and the LED chips 108 are flipped over to mount on the printed circuit, which provides the interconnection between the LED chips 108. As to the electrical connection to the conductive electrode plates 102 and 104, it could be done using the bonding wires 110 or a printed circuit as well.

Figure 15:
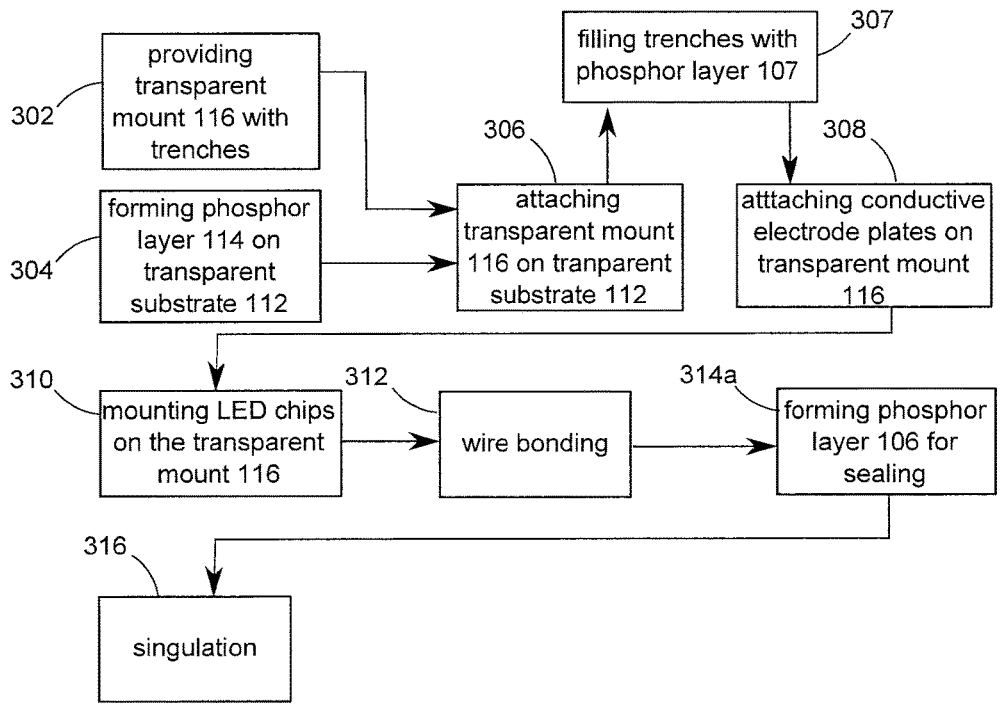
FIG. 15 demonstrates another method for manufacturing an LED assembly.
Figure 16A:
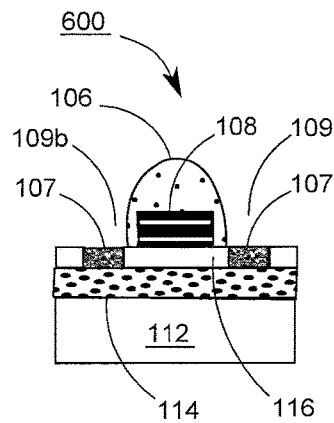
FIGS. 16A and 16B show two cross sectional views of the LED assembly fabricated according to the method in FIG. 15.
Figure 16B:
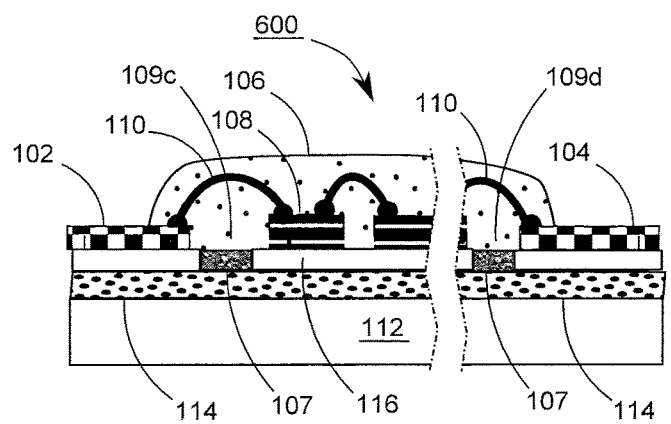

FIG. 15 demonstrates another method for manufacturing an LED assembly, and FIGS. 16A and 16B are cross sectional views of the LED assembly 600 produced according to the method illustrated in FIG. 15. The similarity between FIGS. 15 and 5 is comprehensible according to the disclosed teaching and will be omitted herein for brevity. Different from FIG. 5, in FIG. 15, an additional step 307 is inserted between steps 306 and 308, and another step 314a is in exchange for step 314.

In Step 307, a phosphor layer 107 fills in the trench 109a, 109b, 109c and 109d, as demonstrated in FIGS. 16A and 16B. In one embodiment, the top surface of the phosphor layer 107 is even with that of the transparent mount 116, or in other words the two top surfaces are coplanar. The phosphor layer 107 formed by step 307 could avoid the occurrence of the side leakage of blue light. After the formation of the phosphor layer 107, in step 314a, the phosphor layer 106 is formed to cover the LED chips 108 and the bonding wires 110. The phosphor layer 106 in FIG. 16A does not extend over the phosphor layer 107 or the trenches 109a and 109b. Nevertheless, in step 314a, a phosphor layer 106 can be formed to cover the phosphor layer 107 or the trenches 109a and 109b in some other embodiments. Demonstrated in FIG. 16B, the phosphor layer 106 covers or extends over the trenches 109c and 109d. In the embodiment exemplified in FIGS. 16A and 16B, the LED chips 108 are substantially enclosed by a phosphor capsule composed of the phosphor layers 106, 114, and 107. The light emitted from the LED chips 108 will encounter the phosphor layer 106 and 107 if going upward and sideward, or the phosphor layer 114 if going downward. Therefore, the LED assembly 600 could avoid blue light leakage. The phosphors in the phosphor layers 106, 107, and 114 could be the same, similar or different.

In FIGS. 3A, 3B, 16A, and 16B, the trenches 109a, 109b, 109c, and 109d penetrate through the transparent mount 116, so that the phosphor layer 106 or 107 can contact with the phosphor layer 114 via these trenches. This invention is not limited to the abovementioned, however. FIGS. 17A and 17B demonstrate two cross sectional views of another LED assembly 700, and their similarity with FIGS. 3A and 3B are omitted herein for brevity. The trenches 109a, 109b, 109c and 109d in FIGS. 17A and 17B do not penetrate the transparent mount 116, which means the trenches 109a, 109b, 109c and 109d are shallower in comparison with those in FIGS. 3A and 3B, and each has a bottom larger than 0 µm but not more than 150 µm apart from the top surface of the phosphor layer 114. The phosphor layer 106 does not contact with the phosphor layer 114. The light from the LED chips 108 could not leak through the gap between the phosphor layers 106 and 114 if the gap is less than 150 µm.

In FIGS. 17A and 17B, the LED chips 108 are mounted on a bottom of amounting trench 109g between the trenches 109c, 109d and can avoid blue light leakage.

Some LED assemblies of the disclosure could be used as a filament in an LED bulb to form an omnidirectional lighting apparatus. Some LED assemblies of the disclosure has a blank backside with no pattern, which is immune from scratches and convenient for being contacted, held, or vacuumed during manufacturing processes.

While the disclosure has been described by way of example and in terms of preferred embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An LED assembly, comprising:
   a substrate comprising a first top surface;
   a mount, comprising a second top surface and a bottom surface which is opposite to the second top surface, wherein the mount is positioned on the first top surface in a configuration of forming a recess;
   a first LED chip, comprising a third top surface, and arranged on the first top surface and in the recess;
   a second LED chip formed in the recess;
   an electrode plate, comprising a fourth top surface, arranged on the second top surface, and electrically connected to the first LED chip; and
   a layer, comprising a phosphor, and covering the first LED chip, the second LED chip, the first top surface, and the electrode plate,
   wherein the fourth top surface is higher than the third top surface in an elevation from the first top surface.

2. The LED assembly of claim 1, further comprising a second bonding wire electrically connected to the first LED chip and the second LED chip.

3. The LED assembly of claim 2, wherein the layer covers the second bonding wire.

4. The LED assembly of claim 1, wherein the layer is filled between the first LED chip and the second LED chip.

5. An LED bulb, comprising:
   an LED assembly of claim 1;
   a holding element physically connected to the first electrode plate; and
   a transparent cover covering the LED assembly.

6. The LED bulb of claim 5, wherein the holding element comprises a clamp configured to fasten the LED assembly.

7. The LED bulb of claim 5, wherein the holding element comprises a solid strip.

8. The LED bulb of claim 7, wherein the solid strip comprises a notch.

9. An LED assembly, comprising:
   a substrate comprising a first top surface;
   a mount, comprising a second top surface and a bottom surface which is opposite to the second top surface, wherein the mount is positioned on the first top surface in a configuration of forming a recess;
   a glue layer arranged between the substrate and the mount;
   a first LED chip, comprising a third top surface, and arranged on the first top surface and in the recess;
   an electrode plate, comprising a fourth top surface, arranged on the second top surface, and electrically connected to the first LED chip; and
   a layer, comprising a phosphor, and covering the first LED chip, the first top surface, and the electrode plate,
   wherein the fourth top surface is higher than the third top surface in an elevation from the first top surface.

10. The LED assembly of claim 9, wherein the glue layer directly contacts the substrate and the mount.

11. The LED assembly of claim 9, wherein the first LED chip comprises a plurality of LED cells formed on a common substrate.

12. An LED bulb, comprising:
   an LED assembly of claim 9;
   a holding element physically connected to the first electrode plate; and
   a transparent cover covering the LED assembly.

13. The LED bulb of claim 12, wherein the holding element comprises a clamp configured to fasten the LED assembly.

14. An LED assembly, comprising:
   a substrate comprising a first top surface;
   a mount, comprising a second top surface and a bottom surface which is opposite to the second top surface, wherein the mount is positioned on the first top surface in a configuration of forming a recess;
   a first LED chip, comprising a third top surface, and arranged on the first top surface and in the recess;
   an electrode plate, comprising a fourth top surface, arranged on the second top surface, and electrically connected to the first LED chip; and a layer having a curved surface, comprising a phosphor, and covering the first LED chip, the first top surface, and the electrode plate, wherein the fourth top surface is higher than the third top surface in an elevation from the first top surface.

15. The LED assembly of claim 14, wherein the layer directly contact a portion of the second top surface.

16. The LED assembly of claim 14, further comprising a first bonding wire electrically connected to the first LED chip and the electrode plate.

17. The LED assembly of claim 14, wherein the first LED chip comprises a plurality of LED cells formed on a common substrate.

18. An LED bulb, comprising:
an LED assembly of claim 14;
a holding element physically connected to the first electrode plate; and
a transparent cover covering the LED assembly.

19. The LED bulb of claim 18, wherein the holding element is electrically connected to the electrode plate.

20. The LED bulb of claim 18, wherein the LED bulb is configured to produce an omnidirectional light.

\* \* \* \* \*